US007650585B1

(12) United States Patent
Miller et al.

(10) Patent No.: US 7,650,585 B1
(45) Date of Patent: Jan. 19, 2010

(54) IMPLEMENTING A USER DESIGN IN A PROGRAMMABLE LOGIC DEVICE WITH SINGLE EVENT UPSET MITIGATION

(75) Inventors: Gregory J. Miller, Broomfield, CO (US); Carl H. Carmichael, San Jose, CA (US); Chen Wei Tseng, Longmont, CO (US)

(73) Assignee: XILINX, Inc., San Jose, CA (US)

( * ) Notice: Subject to any disclaimer, the term of this patent is extended or adjusted under 35 U.S.C. 154(b) by 298 days.

(21) Appl. No.: 11/904,713

(22) Filed: Sep. 27, 2007

(51) Int. Cl.
*G06F 17/50* (2006.01)
(52) U.S. Cl. .......................................... 716/16; 716/18
(58) Field of Classification Search .................. 716/16, 716/18
See application file for complete search history.

(56) References Cited

U.S. PATENT DOCUMENTS

| | | | | |
|---|---|---|---|---|
| 6,463,576 | B1 * | 10/2002 | Tomoda ........................ | 716/17 |
| 6,567,969 | B1 * | 5/2003 | Agrawal et al. ............... | 716/17 |
| 7,134,104 | B2 * | 11/2006 | Goodnow et al. .............. | 716/3 |
| 7,313,773 | B1 * | 12/2007 | Braun et al. ................... | 716/5 |
| 2004/0230935 | A1 * | 11/2004 | Samudrala et al. ............ | 716/17 |
| 2005/0125749 | A1 * | 6/2005 | Goodnow et al. .............. | 716/3 |

FOREIGN PATENT DOCUMENTS

JP           01259424 A * 10/1989

OTHER PUBLICATIONS

Carmichael, C. et al., XAPP989 (v1.2 ), Apr. 2, 2008, "Correcting Single-Event Upsets with a Self-Hosting Configuration Management Core", pp. 1-9, Xilinx, Inc. 2100 Logic Drive, San Jose, CA 95124.
Miller, G., et al., XAPP1004 (v1.2 ) Mar. 14, 2008, Single-Event Upset Mitigation Design Flow for Xilinx FPGA PowerPC Systems, pp. 1-9, Xilinx, Inc. 2100 Logic Drive, San Jose, CA 95124.
XAPP197 (v1.0.1) Jul. 6, 2006, Carmichael, Carl, entitled Triple Module Redundancy Design Techniques for Virtex FPGAs, 1-37 pages, Xilinx, Inc., 2100 Logic Drive, San Jose, CA.
XAPP962 (v1.0) Feb. 1, 2007, Miller, Greg et al, entitled Single-Event Upset Mitigation for Xilinx FPGA Block Memories, 1-19 pages, Xilinx, Inc., 2100 Logic Drive, San Jose, CA.

(Continued)

*Primary Examiner*—Phallaka Kik
(74) *Attorney, Agent, or Firm*—LeRoy D. Maunu

(57) ABSTRACT

Various approaches for generating an implementation of an electronic circuit design are disclosed. In one approach, a software portion of the design is compiled into software that is executable by a hard processor disposed on a single semiconductor chip with resources of an programmable logic device (PLD). A first synthesized version of a hardware portion of the design is generated for the PLD. A synthesized memory scrubber having an empty block for an address counter is generated, as well as a triple modular redundant (TMR) address counter. The memory in the first synthesized version of the hardware portion of the design is replaced with the memory scrubber, and a complete set of netlists is generated, including a TMR hardware portion of the design and a single instance of the synthesized memory scrubber. A configuration bitstream is generated from the complete set of netlists and stored for later use.

20 Claims, 6 Drawing Sheets

OTHER PUBLICATIONS

XAPP779 (v1.1) Feb. 19, 2007, Bridgford, Brendan, et al., entitled "Correcting Single-Event Upsets in Virtex-II Platform FPGA Configuration Memory", 1-19 pages, Xilinx, Inc., 2100 Logic Drive, San Jose, CA.

Miller, Gregory, et al., entitled "Robust FPGA/Embedded Processor Design: Design Flow for SEU Mitigation", Sep. 28, 2006, 1-7 pages, MAPLA 2006 paper 178.

* cited by examiner programmable logic, interconnect, I/O, and BRAM resources

IMPLEMENTING A USER DESIGN IN A PROGRAMMABLE LOGIC DEVICE WITH SINGLE EVENT UPSET MITIGATION

FIELD OF THE INVENTION

The present invention generally relates to fault tolerance, and more particularly to tolerance of single event upsets in programmable logic devices caused by high-energy particles.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable primitives that can include, for example, function generators, registers, arithmetic logic, and so forth.

The programmable interconnect and programmable logic are typically programmed by loading a stream of configuration data into internal configuration memory cells that define how the programmable resources are configured. The configuration data can be read from memory (e.g., from an external PROM) or written into the FPGA by an external device. The collective states of the individual memory cells then determine the function of the FPGA.

The function of the FPGA may be altered when the state of certain memory cells is affected by cosmic radiation and the byproducts of radioactive decay. Because the effects of cosmic radiation may increase with increasing altitude, applications for FPGAs at high altitudes and in outer space may be especially vulnerable.

Triple modular redundancy (TMR) may be employed to protect against the unexpected alteration of data stored in FPGA memory cells. With TMR, the design implemented in the programmable logic and interconnect is triplicated and voting circuits are added to compare and determine a correct output from the three outputs of the triplicated logic. The TMRTool from Xilinx, for example, provides the capability to automatically generate TMR for an input design that is targeted to an FPGA.

Programmable logic and interconnect have been configured to implement a processor in combination with BRAM resources implementing the addressable memory for the processor. Program instructions may be stored in the BRAM and fetched and executed by the processor. The MicroBlaze processor implementation from Xilinx, Inc. is an example of such an arrangement. The implementation of a processor on programmable logic and interconnect resources of an FPGA is sometimes referred to as a "soft processor."

TMR may also be applied to systems having one or more soft processors in combination with other application-specific logic implemented on the programmable logic and interconnect resource of an FPGA. For such a system, the TMRTool may be used to triplicate each processor and BRAM instance and instantiate the appropriate voting circuitry. This implementation may consume a very large portion of FPGA resources, however.

FPGA architectures have evolved to include one or more hard-wired processors on the same chip as the programmable logic and interconnect resources. For example, FPGAs from Xilinx may include one or more PowerPC® processors that are hardwired into the chip (a "hard processor"). That is, the functions of the hard processor are not implemented using the programmable logic and interconnect resources of the FPGA.

Use of TMR with a system that is implemented using both the hard processor and programmable logic and interconnect resources of an FPGA may be problematic. Since there are only a finite number of hard processors available on an FPGA, triplicating the hard processors may not be possible. Also, tools such as the TMRTool may not recognize how to deal with hard processors in a TMR context.

The present invention may address one or more of the above issues.

SUMMARY

Various approaches are provided for generating an implementation of an electronic circuit design. In one embodiment, a first portion of the design is compiled into software that is executable by a hard processor disposed on a single semiconductor chip with resources of a programmable logic device (PLD). A first synthesized version of a hardware portion of the design is generated. The first synthesized version includes logic to be implemented on programmable logic and interconnect resources of the PLD and a memory to be implemented with random access memory (RAM) resources of the PLD. A synthesized memory scrubber having an empty block for an address counter is also generated, along with a synthesized triple modular redundant (TMR) address counter. The memory in the first synthesized version of the hardware portion of the design is replaced with the synthesized memory scrubber. A complete set of netlists is generated, including a triple modular redundant hardware portion of the design from the first synthesized version of the hardware portion of the design and a single instance of the synthesized memory scrubber. A configuration bitstream is generated from the complete set of netlists, and is stored for later use.

In another embodiment, an apparatus is provided for generating an implementation of an electronic circuit design. The apparatus comprises means for compiling a first portion of the design into software that is executable by a hard processor disposed on a single semiconductor chip with resources of a PLD; means for generating a first synthesized version of a hardware portion of the design, wherein the first synthesized version includes logic to be implemented on programmable logic and interconnect resources of the PLD and a memory to be implemented with RAM resources of the PLD; means for generating a synthesized memory scrubber having an empty block for an address counter; means for generating a synthesized triple modular redundant address counter; means for replacing the memory in the first synthesized version of the hardware portion of the design with the synthesized memory scrubber; means for generating a complete set of netlists including a triple modular redundant hardware portion of the design from the first synthesized version of the hardware portion of the design and a single instance of synthesized memory scrubber; and means for generating and storing a configuration bitstream from the complete set of netlists.

An article of manufacture, in another embodiment, comprises a processor-readable storage medium configured with processor executable instructions for generating an implementation of an electronic circuit design. When executed by one or more processors, the instructions cause the processor(s) to perform the steps comprising: compiling a first portion of the design into software that is executable by a hard processor disposed on a single semiconductor chip with resources of a PLD; generating a first synthesized version of a hardware portion of the design, wherein the first synthesized version includes logic to be implemented on programmable logic and interconnect resources of the PLD and a memory to be implemented with RAM resources of the PLD; generating a synthesized memory scrubber having an empty block for an address counter; generating a synthesized triple modular redundant address counter; replacing the memory in the first synthesized version of the hardware portion of the design with the synthesized memory scrubber; generating a complete set of netlists including a triple modular redundant hardware portion of the design from the first synthesized version of the hardware portion of the design and a single instance of the synthesized memory scrubber; and generating and storing a configuration bitstream from the complete set of netlists.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

The various embodiments of the invention described herein provide a design process flow for mitigating single event upsets (SEUs) in an electronic system implemented on both programmable logic resources and a hard processor on a PLD, e.g., an FPGA. The system design specifies a software portion and a hardware portion. The software portion is compiled into software that is executable by the hard processor. The hardware portion of the design specifies both memory resources for storing the software to be executed and other application-specific logic to be implemented on programmable logic and interconnect resources of the FPGA. The hardware portion of the design is synthesized into an intermediate set of netlists. Separately, a memory scrubber design is defined and synthesized. The memory scrubber is defined with attributes comparable to those of the memory resources specified in the hardware portion of the design. The memory scrubber generally defines TMR and error correction in a macro that will replace the memory resources specified in the hardware portion of the design. The memory scrubber also includes an empty block for an address counter which is added later in the process. The address counter is created and synthesized separate from the memory scrubber. Using a tool for automatically generating TMR logic from an input netlist, a TMR address counter is generated. The memory in the intermediate set of netlists is replaced by the memory scrubber macro, and the TMR tool is used to generate a final set of netlists with TMR for the hardware portion of the design and a single instance of the memory scrubber with the TMR address counter. Once the final set of netlists is created, the design may be placed-and-routed and from there a configuration bitstream generated. By using both existing tools that automatically generate TMR logic for selected netlists in combination with a customized memory scrubber, a design that mitigates SEUs may be implemented on programmable logic, memory resources, and the hard processor or an FPGA.

Figure 1A:
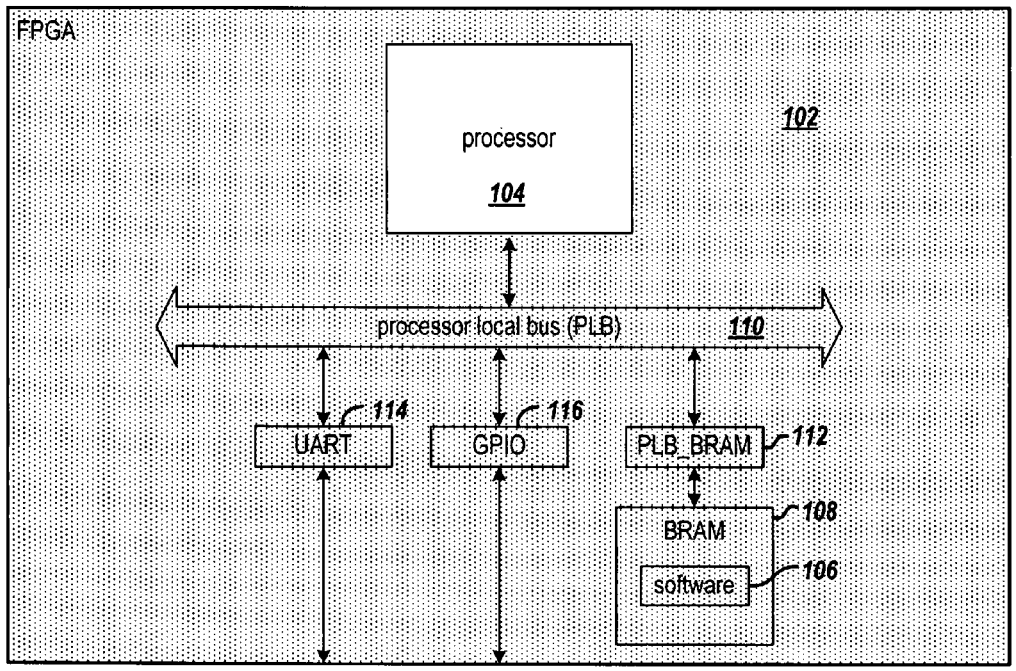
FIG. 1A shows an example system that is implemented on an FPGA having a hard processor.
Figure 1B:
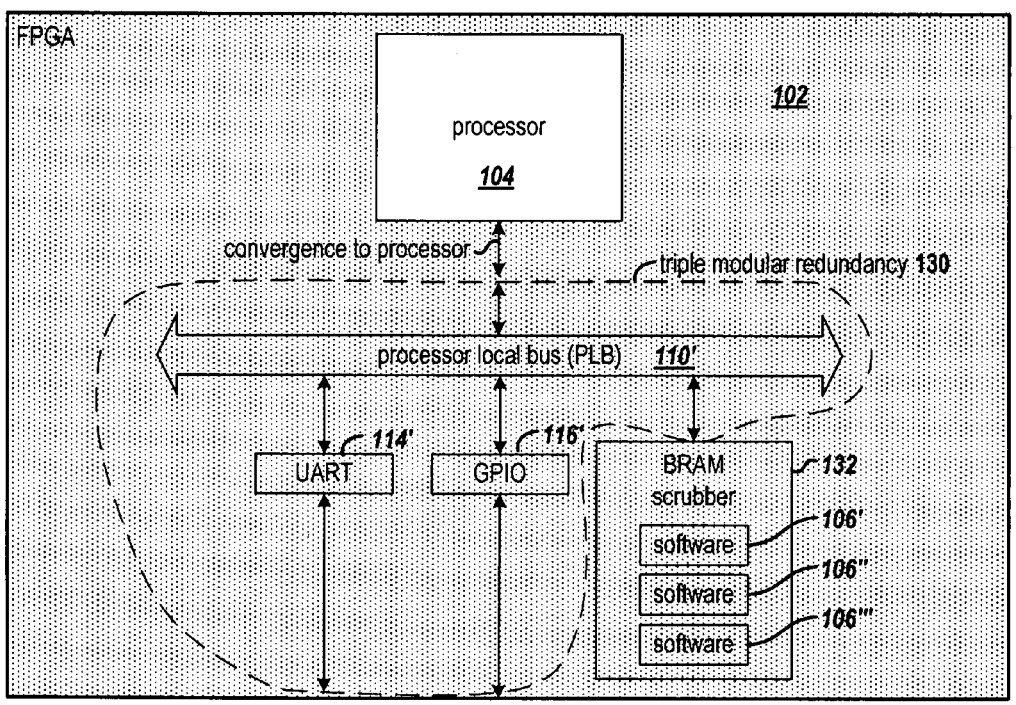
FIG. 1B shows an implementation of the system of FIG. 1A in which the BRAM resources used by the design have been replaced with a BRAM scrubber and TMR has been applied to the remaining logic parts of the system.

FIG. 1A shows an example system that is implemented on an FPGA 102 having a hard processor 104, and FIG. 1B shows an implementation of the system of FIG. 1A in which the BRAM resources used by the design have been replaced with a BRAM scrubber and TMR has been applied to the remaining logic parts of the system.

The system implementation depicted in FIG. 1A generally includes software 106 that is executable by the processor, along with logic that is implemented on the programmable logic, interconnect, and I/O resources of the FPGA. The software is stored in one or more BRAMs 108 available on the FPGA. The example system further includes a processor local bus (PLB) 110, a PLB_BRAM interface 112, a UART interface 114, and a general purpose I/O interface 116, all of which are implemented in the programmable resources of the FPGA. It will be appreciated that different logic may be included for different applications. Thus, the UART and GPIO interfaces may or may not be present in a particular design. Similarly, for other different designs there may be additional logic.

FIG. 1B shows an implementation of the system of FIG. 1A in which certain logic 130 has been made TMR and the memory resources have been replaced with a BRAM scrubber 132. Note that the processor is not triplicated since it is hardwired on the same die as the programmable logic resources of the FPGA. The details of the TMR logic 130 are omitted since the TMR logic may be automatically generated with generally available tools and the details would obfuscate other features of the figure. Generally, however, PLB 110' is a TMR version of PLB 110, UART interface 114' is a TMR version of UART interface 114, and GPIO interface 116' is a TMR version of GPIO interface 116. The interface from the TMR PLB 110' to the processor 104 is converged since only a single instance of the hard processor 104 is present on the FPGA chip 102. For example, a TMR data line (a single logical data line being physically triplicated) is converged into a single physical data line to connect to the processor.

As explained in further detail below, the BRAM scrubber 132 includes memory resources for storing three copies of the software 106', 106", and 106'". The scrubber uses these three copies to determine whether the data read from an address is corrupt and to reestablish correct data in a memory if corruption is detected.

Figure 2:
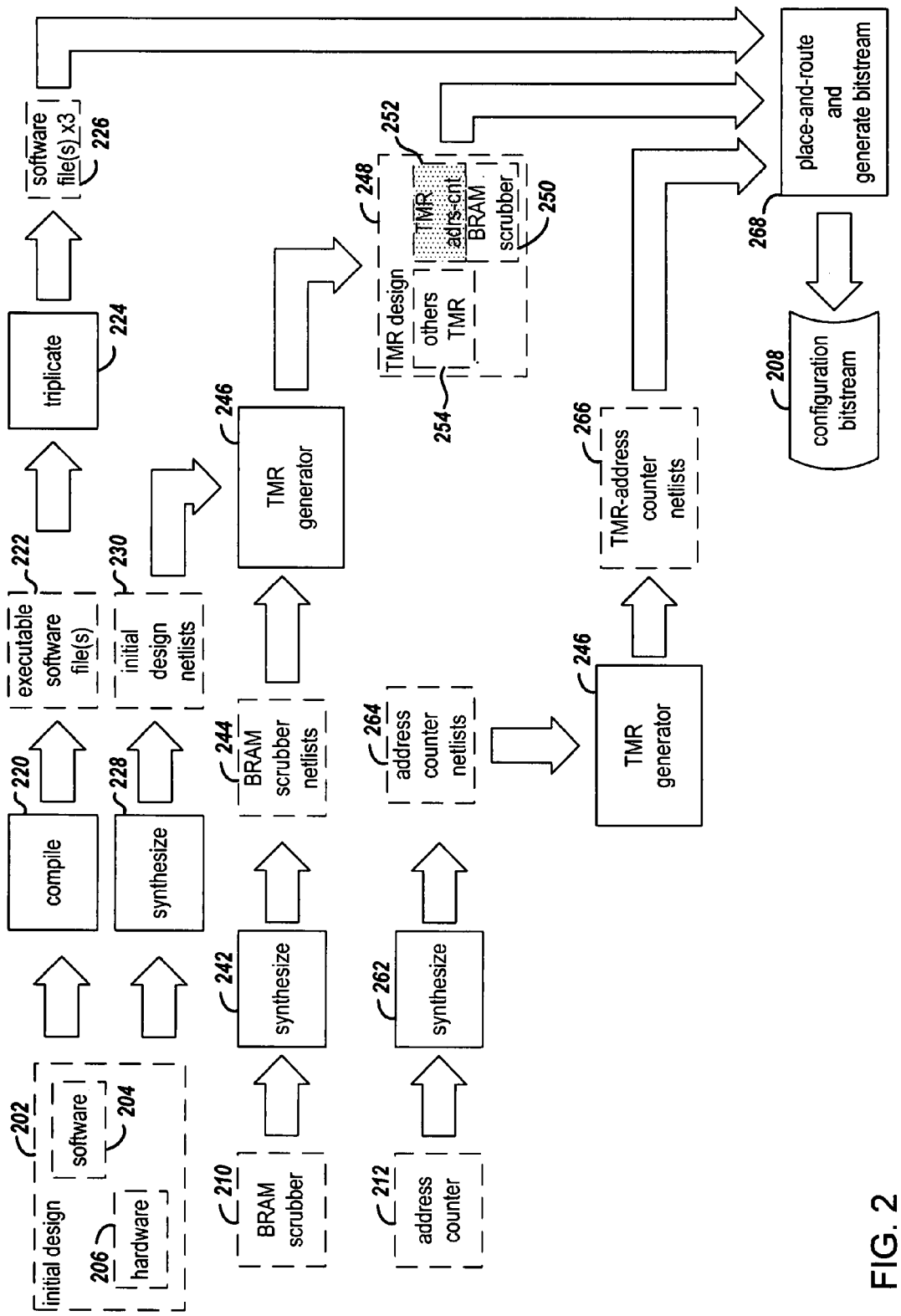
FIG. 2 is a data flow diagram that shows the transformation of a design that includes software and hardware portions into a TMR design that is realized in a configuration bitstream for an FPGA having a hard processor.

FIG. 2 is a data flow diagram that shows the transformation of a design 202 that includes software 204 and hardware 206 portions into a triple modular redundant design that is realized in a configuration bitstream 208 for an FPGA having a hard processor. Data and design files are shown as dashed-line blocks and processing blocks have solid lines. The BRAM scrubber 210 is defined from the initial design and merged into the final design later in the flow.

The software 204 component(s) may be compiled 220 using available compilers depending on the source language and the target processor, for example C source code targeted to the POWERPC® processor. The result is executable program code 222 for the hard processor on the FPGA. The triplicate process 224 modifies a file 226 that contains syntactic descriptions of how individual BRAMs constitute a contiguous logical data space such that three identical copies of the executable program code will be stored in the memory structures in the BRAM scrubber. For example, the user may edit file 226 directly to specify that the executable software is to be stored in the three memories of the block RAM scrubber. The Block RAM scrubber uses majority voting during runtime to determine whether any data value is corrupt and to make any needed corrections in the memory structures.

The initial hardware portion 206 of the design may be synthesized 228 using a synthesis tool suitable for the source specification, e.g., schematics, VHDL, or Verilog, and for the downstream tools that target a particular FPGA. The result is an initial set of netlists 230. At this stage in the design flow, the hardware portion of the design is not yet TMR.

The BRAM scrubber design 210 is created separate from the hardware portion 206 of the initial design since the capabilities of detecting corruption and correcting the corruption in the memory would not be automatically generated by conventional TMR tools as applied to the memory specified in the initial design 202. Thus, TMR is manually generated for the BRAM scrubber design separate from the flow for automated TMR generation and brought into the overall netlist as a replacement for the memory part of the design (BRAMs are replaced with the BRAM scrubber macro). The BRAM scrubber design 210 includes a replacement macro and a wrapper that is suitable for interfacing with the design in which the BRAM is to be used. For example, the BRAM scrubber may be a replacement for memory coupled to a PLB such as that illustrated in FIG. 1A, or may be a memory that is coupled to an on-chip peripheral bus (not shown). The replacement macro may be parameterized to accommodate designs having different memory dimensions. For example, the parameters may allow different data widths, address widths, and/or byte enables to be specified. The BRAM scrubber also includes a block for the address counter that is prepared separately and merged with the BRAM scrubber later in the flow. The BRAM scrubber 210 is synthesized 242 into BRAM scrubber netlists 244.

The initial design netlists 230 and BRAM scrubber netlists 244 are input to the TMR generator 246 for preparing the TMR design netlists 248. In an example embodiment, the TMRTool from Xilinx may be used as the TMR generator. The TMRTool allows the user to specify those components for which TMR logic is and is not to be generated. For the example system, TMR logic is generated for the initial design netlists 230, with the exception of the memory resource netlists in the initial design. Also, TMR is not applied to the BRAM scrubber since it has already been constructed with TMR capabilities. The output of the TMR generator is the TMR design netlists 248, which include the BRAM scrubber netlists 250, a placeholder for the TMR address counter 252, and TMR netlists for the remainder 254 of the design.

The address counter 212 is created separate from the BRAM scrubber 210' because the TMR generator may be used to make the address counter TMR but cannot be used with the BRAM scrubber. The address counter continually cycles through the memory addresses of the memory in the BRAM scrubber for purposes of checking BRAM integrity. The address counter 212 is synthesized 262 into address counter netlists 264, and the netlists are input to the TMR generator 246 for generating TMR address counter netlists 266.

The last phases 268 of the data flow take the input netlists 226, 248, and 266 and place and route the design. A configuration bitstream 208 is then generated from the placed and routed design information.

Figure 3:
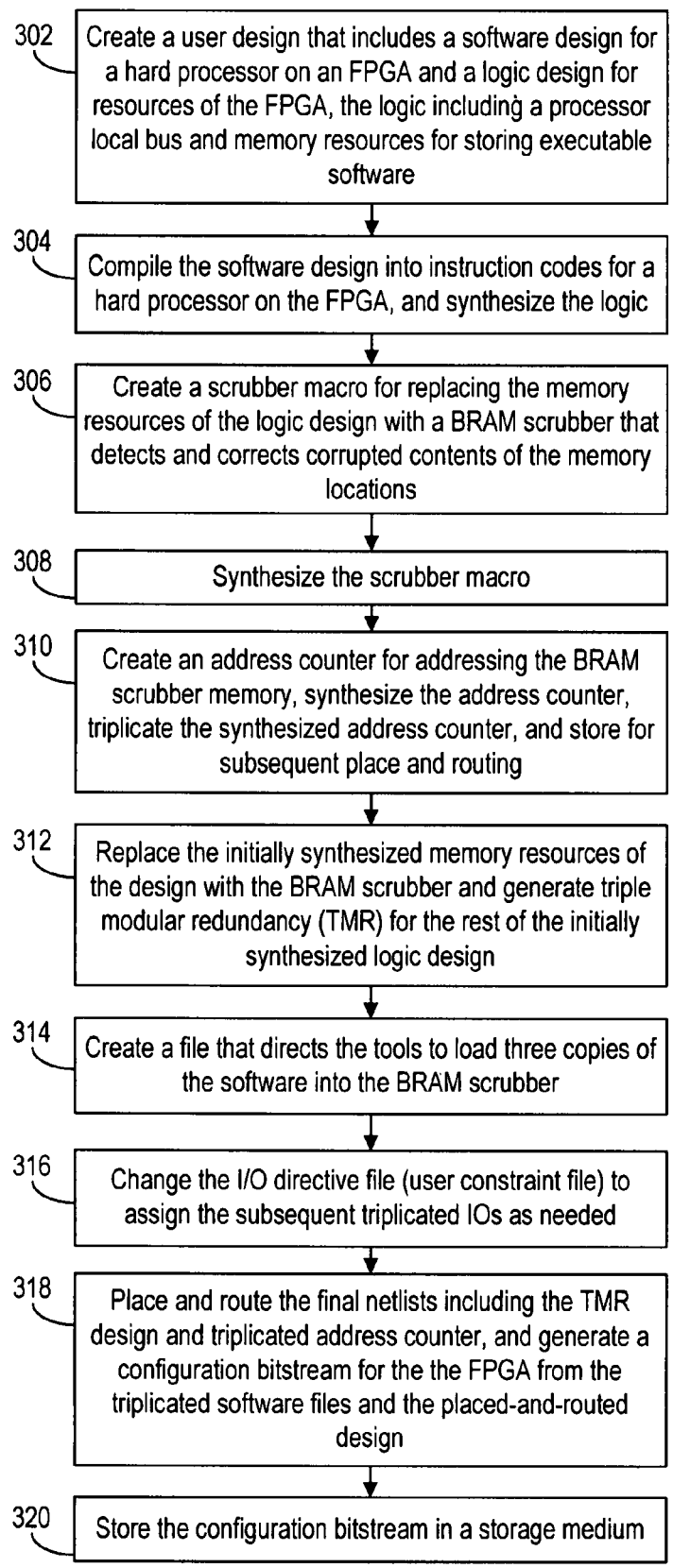
FIG. 3 is a flow diagram of a process for generating an implementation of a user design for an FPGA.

FIG. 3 is a flow diagram of a process for generating an implementation of a user design for an FPGA. The design may include a software portion and a logic portion. A hard processor on the FPGA may execute the instructions for the software design, and these instructions may be stored in one or more block memories provided by the FPGA. The logic design may be implemented in the programmable logic and interconnect resources of the FPGA, and the programmable logic and interconnect resources may be configured to implement the logic design.

At step 302, the user prepares a design that includes a software design for a hard processor on an FPGA and a logic design for resources of the FPGA. The logic portion may include a processor local bus and memory resources for storing executable program code for the software portion of the design.

The software design is compiled into executable instruction codes for a hard processor on the FPGA and the logic portion of the design is synthesized into a netlist representation at step 304. The netlist may specify the connections for each electrical net of an implementation of the logic design. Each net may connect specified ports of specified instances of certain logic primitives. The logic primitives may match the type of logic primitives, such as configurable logic blocks (CLBs) and block memories (BRAMs), that are realized in the programmable logic resources of the PLD. The logic design may specify program storage for the instruction codes of the compiled software design. The program storage may be mapped to one or more BRAMs during synthesis of the logic design. When the program storage is mapped to multiple BRAMS, each BRAM may store a portion of the instruction codes for the storage. It will be appreciated that the program storage may include space for data that is manipulated by the software.

At step 306, a BRAM scrubber macro is prepared. The BRAM scrubber macro is used later in the design flow for replacing the memory resources of the logic design with a BRAM scrubber. The BRAM scrubber generally detects and corrects corrupted contents of memory used in the logic design. The BRAM scrubber includes triplicated memory resources, logic that continually scans for and corrects corrupted data, and a bus interface. The BRAM scrubber is synthesized at step 308. The BRAM scrubber may be prepared without support from a TMR tool, since logic is included for scanning and correcting the memory.

Separate from the BRAM scrubber, a TMR address counter is created at step 310. The address counter is created separate from the BRAM scrubber because TMR tools may be used to automatically generate a TMR version of a single address counter. Thus, a single address counter is created for addressing the BRAM scrubber memory, the address counter is synthesized, and the address counter netlist is input to a TMR tool for generating the TMR address counter. The TMR address counter is stored and merged with the BRAM scrubber during the place-and-route phase of the design flow.

At step 312, the synthesized BRAM scrubber and netlist of the initial design from step 304 are input to a TMR tool. The TMR tool allows the user to specify whether a component is or is not to have TMR logic generated. Thus, for the synthesized BRAM scrubber the designer specifies TMR logic is not to be generated, and for the netlist from the initial design the designer specifies that TMR logic is to be generated. The BRAM scrubber is built as a macro, which causes the TMR tool to replace the memory components in the initial synthesized netlist with the synthesized BRAM scrubber.

Since the BRAM scrubber contains three BRAM memories for each BRAM memory of the initial design, the executable software must be loaded into all three BRAM memories in the BRAM scrubber. In one embodiment, the software may be loaded into the BRAM scrubber at the time the FPGA is configured. In another embodiment, the software may be loaded post-configuration and as part of a system initialization procedure. At step 314, a tool-specific file is created to direct the tools to load three copies (e.g., exact copies) of the software into the BRAM memories in the BRAM scrubber.

At step 316, the input/output (I/O) directive file (constraint file) is changed by the designer to assign the subsequent triplicated IO pins as needed. Since the I/O pins are triplicated, the user must assign the extra I/Os used in the design to the appropriate physical pins on the FPGA.

The final netlists are placed and routed at step 318. The final netlists include the TMR design in which the BRAM scrubber and the TMR address counter have replaced the BRAM memory of the initial design. A configuration bitstream is generated for the FPGA from the placed-and-routed design, and at step 320 the configuration bitstream is stored in persistent storage for subsequent retrieval and configuration of an FPGA.

Figure 4A:
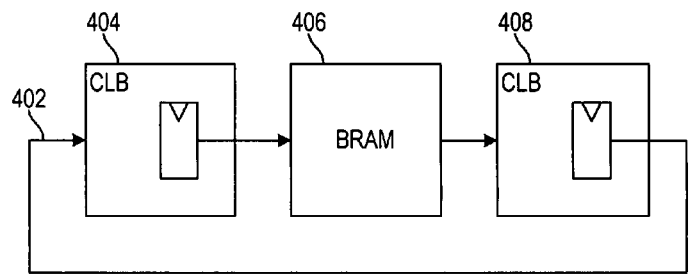
FIGS. 4A and 4B are block diagrams illustrating the application of TMR to part of a logic design which includes BRAM resources of an FPGA through use of an existing tool that automatically generates TMR from an input design.
Figure 4B:
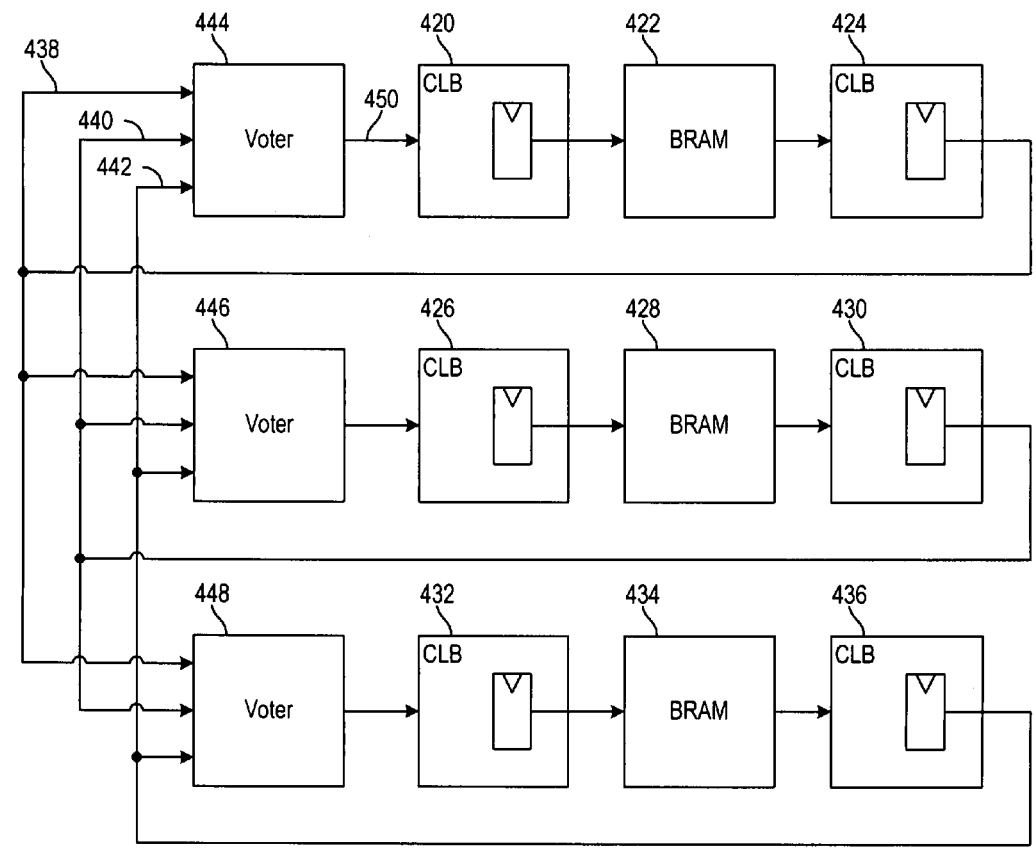

FIGS. 4A and 4B are block diagrams illustrating the application of triple modular redundancy to part of a logic design which includes BRAM resources of an example FPGA through use of an existing tool that automatically generates TMR from an input design. FIG. 4A is a block diagram for the example logic design before adding the triple redundancy, and FIG. 4B is a block diagram for the example logic design after adding the triple redundancy. Note that the simple application of TMR to the BRAM design is unsuitable for designs in which the BRAMs are used for storing software that is executed by a hard processor and in which mitigation of SEU effects is desired, because there is no correction of potentially corrupted software in the BRAMs if an upset is detected.

A netlist that is synthesized from the example logic design may be separated into feedback signals and forward logic paths. For the netlist of the example logic design of FIG. 4A, the feedback signal on line 402 may be identified along with the forward logic path that passes through primitive instances 404, 406, and 408. CLB instances 404 and 408 may implement certain functions of the logic design, and BRAM instance 406 may implement a large look-up table of the logic design, for example.

The netlist for FIG. 4A may be modified to include three copies of each of the forward logic paths, as shown in FIG. 4B. The first redundant copy may be the forward logic path passing through instances 420, 422, and 424, the second redundant copy may be the forward logic path passing through instances 426, 428, and 430, and the third redundant copy may be the forward logic path passing through instances 432, 434, and 436.

Each of the three redundant copies may generate respective feedback signals on lines 438, 440, and 442. Three voters 444, 446, and 448 may each receive all of the feedback signals on lines 438, 440, and 442. Voter 434, for example, may compare values of the feedback signals on lines 438, 440, and 442 and forward a value on line 450 that matches the value of a majority of the feedback signals on lines 438, 440, and 442.

Thus, if the feedback signals on lines 438 and 442 have the same value but the value on line 440 is different, then voter 444 may produce a value on line 450 that equals the matching values on lines 438 and 442. The value of the feedback signal on line 440 may be incorrect because of a single corruption within any of instances 426, 428, 430, or voter 446. Voters 444, 446, and 448 may block the propagation of the corrupted value of the feedback signal on line 440. Because voter 446 blocks the propagation of the corrupted value of the feedback signal on line 440, the correct data flows through instances 426, 428, and 430, such that the feedback signal on line 440 returns to providing the correct value. Thus, a corruption created within one of the voters or instances may be corrected and the logic design may quickly become ready to correct the next corruption.

Figure 5:
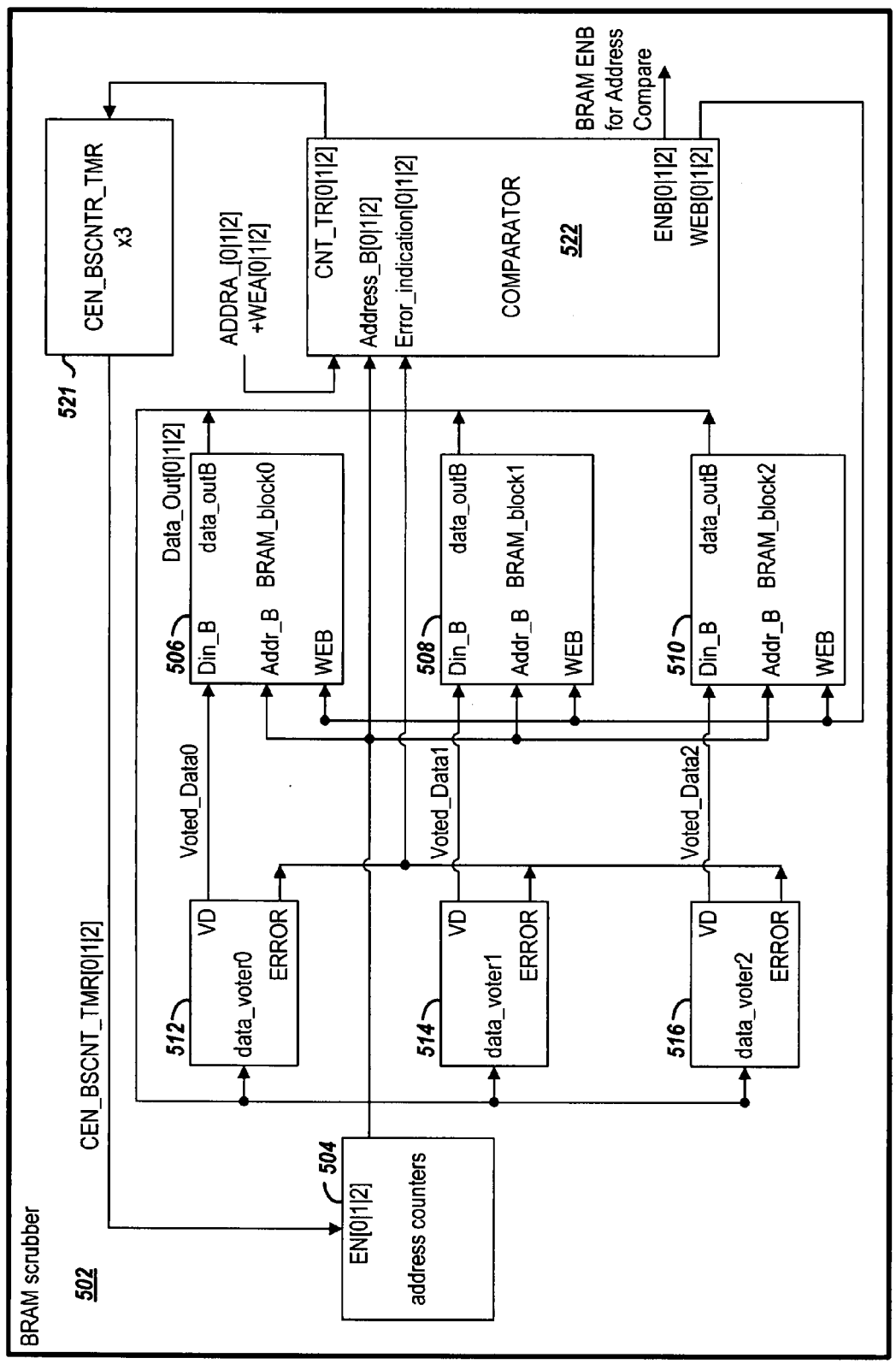
FIG. 5 is a block diagram that illustrates a BRAM scrubber for correcting corruption of instructions of a software design in accordance with various embodiments of the invention.

FIG. 5 is a block diagram that illustrates a BRAM scrubber for correcting corruption of instructions of a software design in accordance with various embodiments of the invention. Synthesis of a logic design may produce a netlist that includes a block memory for storing a portion of the instruction codes of a software design. To correct corruption of the instruction codes in the block memory, various embodiments of the invention may modify the netlist to replace the block memory with a circuit arrangement based on BRAM scrubber 502. The BRAM scrubber 502 includes additional logic that is not shown in FIG. 5. This logic includes the interface for reading from and writing to the memory via the PLB 110', for example.

In an example embodiment the block memory resources are dual ported, having ports A and B. Port A is used by the design to read from and write to the memory according to design requirements. Port B is used by the BRAM scrubber logic to detect and correct corrupt data in the memory. The illustration of BRAM scrubber 502 is limited to the scrubber logic associated with port B of the block memories. Since the function of the BRAM scrubber relative to reading from and writing to the memory by application logic is well understood, the present discussion is limited to the scrubbing logic.

The TMR address counters 504 count through the address space provided by the BRAM blocks 506, 508, and 510. The address is provided to the port B address port, Addr_B, of each of the BRAMs. The addressed data is presented at the port B data_outB ports of the BRAMs. The output data from the BRAMs 506, 508, and 510 is voted on by each of the data voters 512, 514, and 516. The data that is the same for at least two of the BRAMs is presented as corrected data on the output pin VD of the voters and at the port B data input pin Din_B of the BRAMs. If the voters detect an error (one of the data values is not equal to the other two), error signals are presented at the ERROR pins and provided as input to the comparator 522. In response to a signaled error, the comparator activates the write enable signal at the pins WEB[0|1|2], which is provided to the B-port write enable pins (WEB) of the BRAMs. This enables writing of the corrected data to the BRAMs. While correct data is being written, the TMR address counters 504 are not enabled with the signals at the enable pins EN[0|1|2] by the CEN_BSCNTR_TMR block. The CEN_BSCNTR_TMR block 521 is signaled by the comparator 522 on the CNT_TR[0|1|2] pins when an error is detected and in response the CEN_BSCNTR_TMR block disables the chip enable signals to the TMR address counter 504. After the data has been corrected, the comparator signals the CEN_BSCNTR_TMR block that the counter may be enabled. The TMR address counters are incremented to repeat the process after an address has been read and corrected if necessary.

The comparator 522 further resolves conflicts between writes to the A and B ports of the BRAM blocks 506, 508, and 510. For example, the design may attempt to write to the same address on port A as the BRAM scrubber is attempting to write to on port B. The comparator detects this conflict and gives write access to port A, while disabling the WEB[0|1|2] signals. The ENB[0|1|2] port outputs the BRAM ENB for Address Compare which is the signal that enables or disables side B of the BRAM in case there is an address conflict, since the WEB [0|1|2] enables are always activated on an error.

Figure 6:
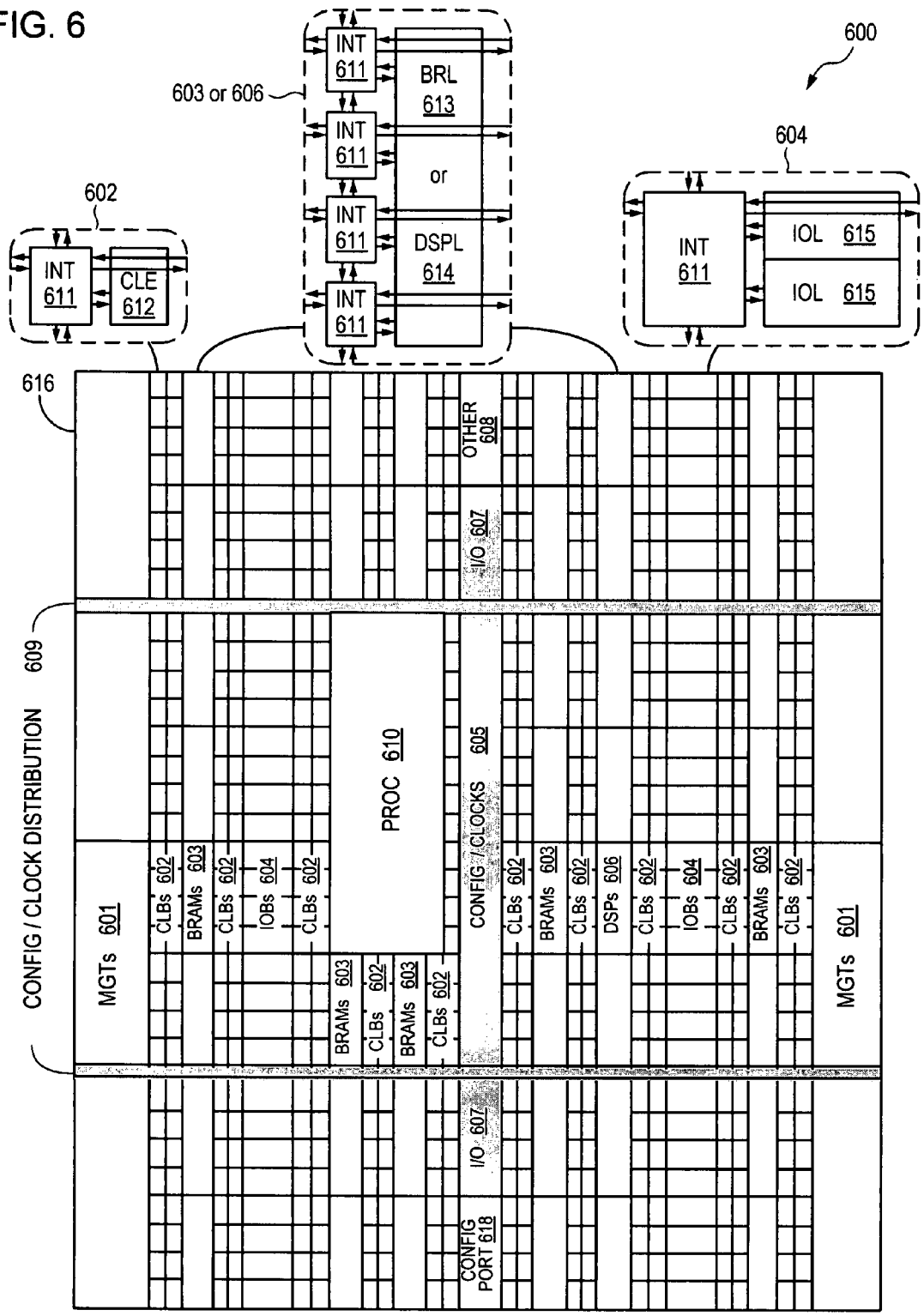
FIG. 6 illustrates an example FPGA architecture on which a system may be implemented using the various approaches described herein.

FIG. 6 illustrates an example FPGA architecture 600 on which a system may be implemented using the various approaches described herein. FPGA 600 includes a large number of different programmable tiles including multi-gigabit transceivers (MGTs 601), configurable logic blocks (CLBs 602), random access memory blocks (BRAMs 603), input/output blocks (IOBs 604), configuration and clocking logic (CONFIG/CLOCKS 605), digital signal processing blocks (DSPs 606), specialized input/output blocks (I/O 607) (e.g., configuration ports and clock ports), and other programmable logic 608 such as digital clock managers, analog-to-digital converters, system monitoring logic, and so forth. Some FPGAs also include a hardwired processor 610.

In some FPGAs, each programmable tile includes a programmable interconnect element (INT 611) having standardized connections to and from a corresponding interconnect element in each adjacent tile. Therefore, the programmable interconnect elements taken together implement the programmable interconnect resources for the illustrated FPGA. The programmable interconnect element (INT 611) also includes the connections to and from the programmable logic primitive within the same tile, as shown by the examples included at the top of FIG. 6.

For example, a CLB 602 can include a configurable logic primitive (CLE 612) that can be programmed to implement user logic plus a single programmable interconnect element (INT 611). A BRAM 603 can include a BRAM logic primitive (BRL 613) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 606 can include a DSP logic primitive (DSPL 614) in addition to an appropriate number of programmable interconnect elements. An IOB 604 can include, for example, two instances of an input/output logic primitive (IOL 615) in addition to one instance of the programmable interconnect element (INT 611). As will be clear to those of skill in the art, the actual I/O pads connected, for example, to the I/O logic primitive 615 are manufactured using metal layered above the various illustrated logic blocks, and typically are not confined to the area of the input/output logic primitive 615.

Some FPGAs utilizing the architecture illustrated in FIG. 6 include additional logic blocks that disrupt the regular columnar structure making up a large part of the FPGA. The additional logic blocks can be programmable blocks and/or dedicated logic. For example, the processor block PROC 610 shown in FIG. 6 spans several columns of CLBs and BRAMs.

In the pictured embodiment, a columnar area near the center of the die (shown shaded in FIG. 6) is used for configuration, clock, and other control logic. Horizontal areas 609 extending from this column are used to distribute the clocks and configuration signals across the breadth of the FPGA.

Configuration port 618 may be used to access configuration memory in the FPGA 616 to configure the programmable logic and interconnect resources. In one embodiment, an internal scrubber (not shown) may continuously read and correct configuration memory via an internal configuration access port.

Note that FIG. 6 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 6 are purely exemplary. For example, in an actual FPGA more than one adjacent column of CLBs is typically included wherever the CLBs appear, to facilitate the efficient implementation of user logic.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable media or delivery channels such as magnetic or optical disks or tapes, electronic storage devices, or as application services over a network.

The present invention is thought to be applicable to a variety of systems for creating TMR designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method for generating an implementation of an electronic circuit design, the method comprising:
    compiling a first portion of the design into software that is executable by a hard processor disposed on a single semiconductor chip with resources of a programmable logic device (PLD);
    generating a first synthesized version of a hardware portion of the design, wherein the first synthesized version includes logic to be implemented on programmable logic and interconnect resources of the PLD and a memory to be implemented with random access memory (RAM) resources of the PLD;
    generating a synthesized memory scrubber having an empty block for an address counter;
    generating a synthesized triple modular redundant address counter;
    replacing the memory in the first synthesized version of the hardware portion of the design with the synthesized memory scrubber;
    generating a complete set of netlists including a triple modular redundant hardware portion of the design from the first synthesized version of the hardware portion of the design and a single instance of the synthesized memory scrubber; and
    generating and storing a configuration bitstream from the complete set of netlists.

2. The method of claim 1, wherein:
    the RAM resources of the PLD include a plurality of block memories; and
    the generating of the memory scrubber includes specifying at least three of the block memories for each block memory in the first synthesized version of the hardware portion of the design, and further specifying respective data voters associated with the at least three of the block memories for detecting and correcting corrupted data in the at least three of the block memories.

3. The method of claim 2, wherein each respective data voter, in response to detecting a corrupted data value at an address in an associated one of the at least three of the block memories, writes a correct value from another one of the at least three of the block memories to the address in the one of the at least three of the block memories.

4. The method of claim 3, wherein:
the address counter generates a sequence of addresses and provides each of the addresses in sequence to the at least three of the block memories; and
for each of the addresses, each of the data voters compares data at the address in the associated block memory with data at the address in the other block memories and overwrites the data in the associated block memory with the data from the other block memories in response to the data from the other block memories being equal and the data from the associated block memory being not equal to the data from the other block memories.

5. The method of claim 4, wherein the address counter counts continuously, pauses counting in response to detection of corrupt data, and resumes counting in response to correction of the data.

6. The method of claim 5, wherein data in the block memories includes executable instructions for the hard processor.

7. The method of claim 6, wherein data in the block memories includes data manipulated by the hard processor in executing the instructions.

8. The method of claim 3, wherein:
the hardware portion of the design includes a processor local bus that is coupled to the hard processor;
each block memory in the memory scrubber has a first access port respectively coupled to an instance of the processor local bus in the triple modular redundant hardware portion of the design; and
a second access port of each of the block memories is respectively coupled to an instance of the triple modular redundant address counter and to a respective one of the data voters.

9. The method of claim 3, wherein the generating and storing a configuration bitstream comprises including at least three copies of the executable software in the configuration bitstream for respectively loading each copy into the at least three block memories of the memory scrubber.

10. The method of claim 1, wherein the generating the synthesized triple modular redundant address counter comprises:
inputting a specification of a single address counter to a software tool; and
generating by the software tool the synthesized triple modular redundant address counter in response to the inputting of the single address counter.

11. An apparatus for generating an implementation of an electronic circuit design, the apparatus comprising:
means for compiling a first portion of the design into software that is executable by a hard processor disposed on a single semiconductor chip with resources of a programmable logic device (PLD);
means for generating a first synthesized version of a hardware portion of the design, wherein the first synthesized version includes logic to be implemented on programmable logic and interconnect resources of the PLD and a memory to be implemented with random access memory (RAM) resources of the PLD;
means for generating a synthesized memory scrubber having an empty block for an address counter;
means for generating a synthesized triple modular redundant address counter;
means for replacing the memory in the first synthesized version of the hardware portion of the design with the synthesized memory scrubber;
means for generating a complete set of netlists including a triple modular redundant hardware portion of the design from the first synthesized version of the hardware portion of the design and a single instance of the synthesized memory scrubber; and
means for generating and storing a configuration bitstream from the complete set of netlists.

12. An article of manufacture, comprising:
a processor-readable storage medium configured with processor executable instructions for generating an implementation of an electronic circuit design by performing the steps including,
compiling a first portion of the design into software that is executable by a hard processor disposed on a single semiconductor chip with resources of a programmable logic device (PLD);
generating a first synthesized version of a hardware portion of the design, wherein the first synthesized version includes logic to be implemented on programmable logic and interconnect resources of the PLD and a memory to be implemented with random access memory (RAM) resources of the PLD;
generating a synthesized memory scrubber having an empty block for an address counter;
generating a synthesized triple modular redundant address counter;
replacing the memory in the first synthesized version of the hardware portion of the design with the synthesized memory scrubber;
generating a complete set of netlists including a triple modular redundant hardware portion of the design from the first synthesized version of the hardware portion of the design and a single instance of the synthesized memory scrubber; and
generating and storing a configuration bitstream from the complete set of netlists.

13. The article of manufacture of claim 12, wherein:
the RAM resources of the FPGA include a plurality of block memories; and
the generating of the memory scrubber includes specifying at least three of the block memories for each block memory in the first synthesized version of the hardware portion of the design, and further specifying respective data voters associated with the at least three of the block memories for detecting and correcting corrupted data in the at least three of the block memories.

14. The article of manufacture of claim 13, wherein each respective data voter, in response to detecting a corrupted data value at an address in an associated one of the at least three of the block memories, writes a correct value from another one of the at least three of the block memories to the address in the associated one of the at least three block memories.

15. The article of manufacture of claim 14, wherein:
the address counter generates a sequence of addresses and provides each of the addresses in sequence to the at least three of the block memories; and
for each of the addresses, each of the data voters compares data at the address in the associated block memory with data at the address in the other block memories and overwrites the data in the associated block memory with the data from the other block memories in response to the data from the other block memories being equal and the data from the associated block memory being not equal to the data from the other block memories.

16. The article of manufacture of claim 15, wherein the address counter counts continuously, pauses counting in response to detection of corrupt data, and resumes counting in response to correction of the data.

17. The article of manufacture of claim 16, wherein data in the block memories includes executable instructions for the hard processor and data manipulated by the hard processor in executing the instructions.

18. The article of manufacture of claim 14, wherein:
the hardware portion of the design includes a processor local bus that is coupled to the hard processor;
each block memory in the memory scrubber has a first access port respectively coupled to an instance of the processor local bus in the triple modular redundant hardware portion of the design; and
a second access port of each of the block memories is respectively coupled to an instance of the triple modular redundant address counter and to a respective one of the data voters.

19. The article of manufacture of claim 14, wherein the generating and storing a configuration bitstream comprises including at least three copies of the executable software in the configuration bitstream for respectively loading each copy into the at least three block memories of the memory scrubber.

20. The article of manufacture of claim 12, wherein the generating the synthesized triple modular redundant address counter comprises:
inputting a specification of a single address counter to a software tool; and
generating by the software tool the synthesized triple modular redundant address counter in response to the inputting of the single address counter.

* * * * *